United States Patent
Wang et al.

(10) Patent No.: US 7,218,655 B2
(45) Date of Patent: May 15, 2007

(54) SOLID STATE LASER INSENSITIVE TO TEMPERATURE CHANGES

(75) Inventors: Sean Xiaolu Wang, Centerville, DE (US); Qun Li, Newark, DE (US); Rongsheng Tian, Newar, DE (US)

(73) Assignee: B&W Tek Property, Inc., Newark, DE (US)

( * ) Notice: Subject to any disclaimer, the term of this patent is extended or adjusted under 35 U.S.C. 154(b) by 0 days.

(21) Appl. No.: 11/245,451

(22) Filed: Oct. 7, 2005

(65) Prior Publication Data

US 2006/0078019 A1    Apr. 13, 2006

Related U.S. Application Data

(60) Provisional application No. 60/616,837, filed on Oct. 8, 2004.

(51) Int. Cl.
 *H01S 3/13* (2006.01)
 *H01S 3/10* (2006.01)

(52) U.S. Cl. .................. 372/29.01; 372/20; 372/29.02

(58) Field of Classification Search ........... 372/21–23, 372/29.01–29.011, 29.014–29.022, 38.1–38.02, 372/92, 98, 99, 102
See application file for complete search history.

(56) References Cited

U.S. PATENT DOCUMENTS

| | | | |
|---|---|---|---|
| 4,767,197 A * | 8/1988 | Yeh ............................ 359/244 |
| 5,038,352 A * | 8/1991 | Lenth et al. .................. 372/21 |
| 5,159,487 A * | 10/1992 | Geiger et al. ............... 359/330 |
| 5,181,214 A | 1/1993 | Berger et al. |
| 5,195,104 A * | 3/1993 | Geiger et al. ................. 372/97 |
| 5,214,666 A * | 5/1993 | Watanabe et al. ............. 372/69 |
| 5,757,831 A * | 5/1998 | Kmetec et al. ........ 372/29.011 |
| 5,856,994 A * | 1/1999 | Hayakawa .................... 372/75 |
| 5,864,399 A * | 1/1999 | Girvin et al. ............... 356/339 |
| 6,101,201 A | 8/2000 | Hargis et al. |
| 6,366,596 B1 * | 4/2002 | Yin et al. ..................... 372/92 |
| 6,570,895 B2 | 5/2003 | Heberle |
| 6,724,787 B2 * | 4/2004 | Masterson et al. ............ 372/21 |
| 2002/0009105 A1 * | 1/2002 | Matsumoto .................. 372/34 |
| 2005/0105084 A1 | 5/2005 | Wang et al. |
| 2005/0207466 A1 * | 9/2005 | Glebov et al. ................ 372/92 |
| 2006/0251142 A1 * | 11/2006 | Volodin et al. ............... 372/93 |
| 2006/0251143 A1 * | 11/2006 | Volodin et al. ............. 372/102 |

* cited by examiner

*Primary Examiner*—Minsun Oh Harvey
*Assistant Examiner*—Phillip Nguyen
(74) *Attorney, Agent, or Firm*—Blank Rome LLP

(57) ABSTRACT

A temperature insensitive diode-pumped solid state laser is disclosed in this invention. The components of the laser are optimized with temperature insensitive design, making the laser capable of operating in a wide temperature range without using any cooling/heating system to maintain the temperature of its components.

9 Claims, 2 Drawing Sheets

SOLID STATE LASER INSENSITIVE TO TEMPERATURE CHANGES

REFERENCE TO RELATED APPLICATION

The present application claims the benefit of U.S. Provisional Application No. 60/616,837, filed Oct. 8, 2004, whose disclosure is hereby incorporated by reference in its entirety into the present disclosure.

FIELD OF INVENTION

This invention generally relates to a solid state laser and more specifically to a diode-pumped solid state laser insensitive to environmental temperature variations.

BACKGROUND OF THE INVENTION

A diode-pumped solid state laser generally comprises a laser diode as the pump source and a laser cavity formed by a laser gain crystal and two reflective mirrors. The laser cavity may further comprise a nonlinear crystal for optical frequency conversion. The performance of the laser, such as its output power, noise level, and mode pattern, is very sensitive to environmental temperature variations. Thus, the laser can only operate within a narrow temperature range, beyond which the power of the laser may drop quickly or overshoot outside the safety limit. The noise level and the mode pattern of the laser may also degrade greatly.

This problem is addressed in the prior art by using thermal control systems, including those active cooling/heating systems that employ thermo-electronic coolers, or those passive cooling systems that employ fluid/air coolants or phase change materials. Some examples can be found in U.S. Pat. No. 5,181,214, 'Temperature Stable Solid-State Laser Package' disclosed by Berger et al., U.S. Pat. No. 6,101,201, 'Solid state laser with longitudinal cooling' disclosed by Hargis et al., and U.S. Pat. No. 6,570,895, 'Laser systems using phase change material for thermal control' disclosed by Heberle.

However, the incorporation of the thermal control system makes the laser cumbersome in size and/or high in power consumption, which is not suitable for some applications such as portable and battery powered laser modules for search and rescue signaling, field measurement instruments, and laser pointers, etc.

SUMMARY OF THE INVENTION

There thus exists a need for diode-pumped solid state lasers that do not require thermal control systems to maintain their performance over environmental temperature variations.

According to one aspect of the current invention, temperature insensitive operation of the solid state laser is achieved by locking the output wavelength of the pump laser diode through a Bragg grating device. Thus the output wavelength of the laser diode matches with the absorption band of the laser gain crystal regardless of temperature variation.

According to another aspect of the current invention, multiple nonlinear crystals with different crystal orientations are employed for optical frequency conversion, where different nonlinear crystals operate in different temperature ranges. Thus the whole crystal module can operate in a wide temperature range.

According to yet another aspect of the current invention, a feedback control circuit is provided to automatically adjust the power of the laser diode according to the output power of the solid state laser and maintain a constant output power level for the solid state laser.

DETAILED DESCRIPTION OF THE PREFERRED EMBODIMENTS

Figure 1:
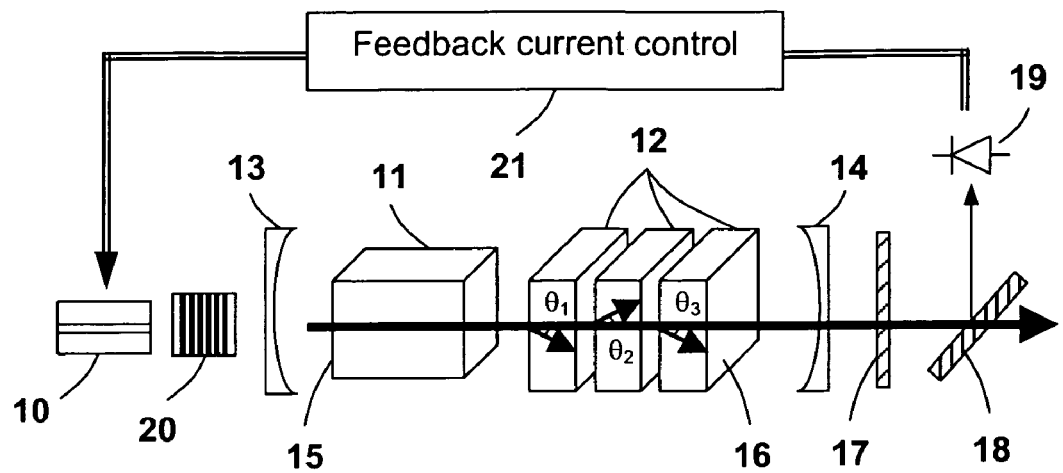
FIG. 1 illustrates the structure of an exemplary temperature insensitive solid state laser.

In one preferred embodiment of the current invention as illustrated in FIG. 1, the laser is a diode-pumped frequency-doubled solid-state laser emitting at a wavelength of 532 nm. The laser comprises a 809 nm laser diode 10 as the pump source; a gain crystal 11, such as a Nd:YVO$_4$, Nd:YAG, or other laser crystals, for generating 1064 nm infrared light emission under the diode pump; and one or more nonlinear crystals 12, such as KTP or LBO crystals, for second harmonic generation (SHG) or frequency doubling, which produces the 532 nm visible light. The laser cavity is formed by two mirrors 13, 14 and/or by the two facets 15, 16 of the crystals, which are coated with thin film reflectors for wavelength selective reflection. The reflector 13 (15) has high reflection at 1064 nm and high transmission at 809 nm. The reflector 14 (16) has high reflection at 1064 nm and high transmission at 532 nm. An infrared filter 17 is used to filter out the residual 809 nm and 1064 nm infrared light at the output end of the laser. A small portion of the laser output is tapped out by a beam splitter 18 and sent to a photo detector 19 for laser power monitoring. In this embodiment, the laser system as a whole and the associated components are all optimized with temperature insensitive design as described below.

Figure 2:
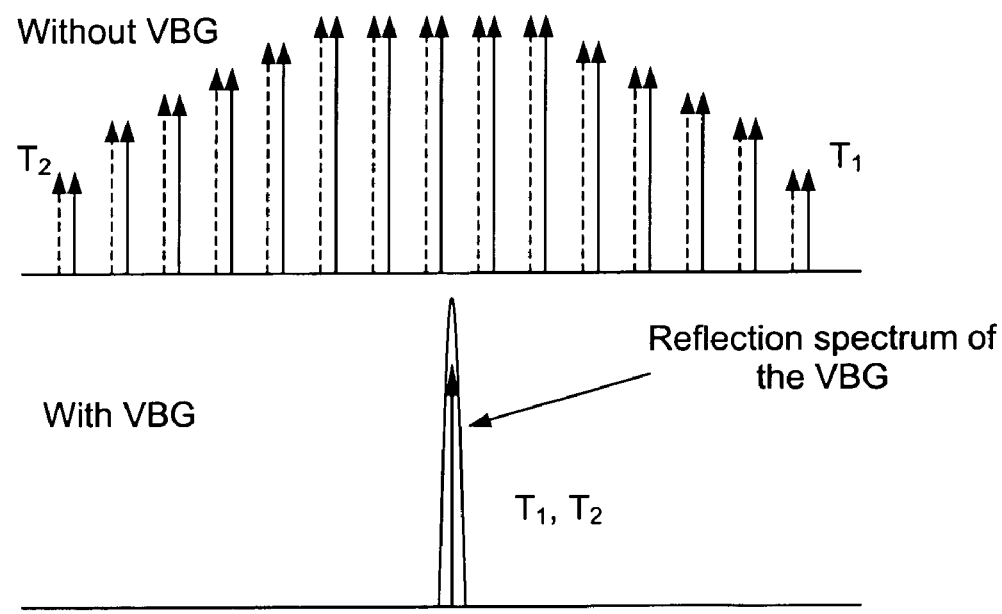
FIG. 2 illustrates the mechanism of wavelength locking for the pump laser diode through a volume Bragg grating.

Firstly, the output wavelength of the pump laser diode is stabilized by a volume Bragg grating (VBG) 20 as shown in FIG. 1. The basic structure of the wavelength stabilized laser diode is similar to the device which was disclosed in U.S. patent application Ser. No. 10/985,981, filed Nov. 12, 2004, titled as 'Spectroscopic apparatus using spectrum narrowed and stabilized laser with Bragg grating' by Sean Xiaolu Wang, et al, whose disclosure is hereby incorporated by reference in its entirety into the present disclosure. The laser diode comprises a broad stripe laser diode chip and an integrated VBG, which works as a narrowband reflector. Without the VBG, the laser diode operates in multiple longitudinal modes as illustrated in FIG. 2, whose wavelength may drift with ambient temperature at a rate as large as 0.3 nm/° C. This pump wavelength shift will result in laser power fluctuation as the absorption coefficient of the laser gain crystal is highly dependent on pump wavelength. After incorporating the VBG to form a compact external cavity for the pump laser diode, not only is the linewidth of the laser diode narrowed to one or a few longitudinal modes, but the lasing wavelength is also locked to the wavelength defined by the VBG, which is much less sensitive to temperature changes (with a temperature sensitivity of 0.01 nm/° C.).

Figure 3:
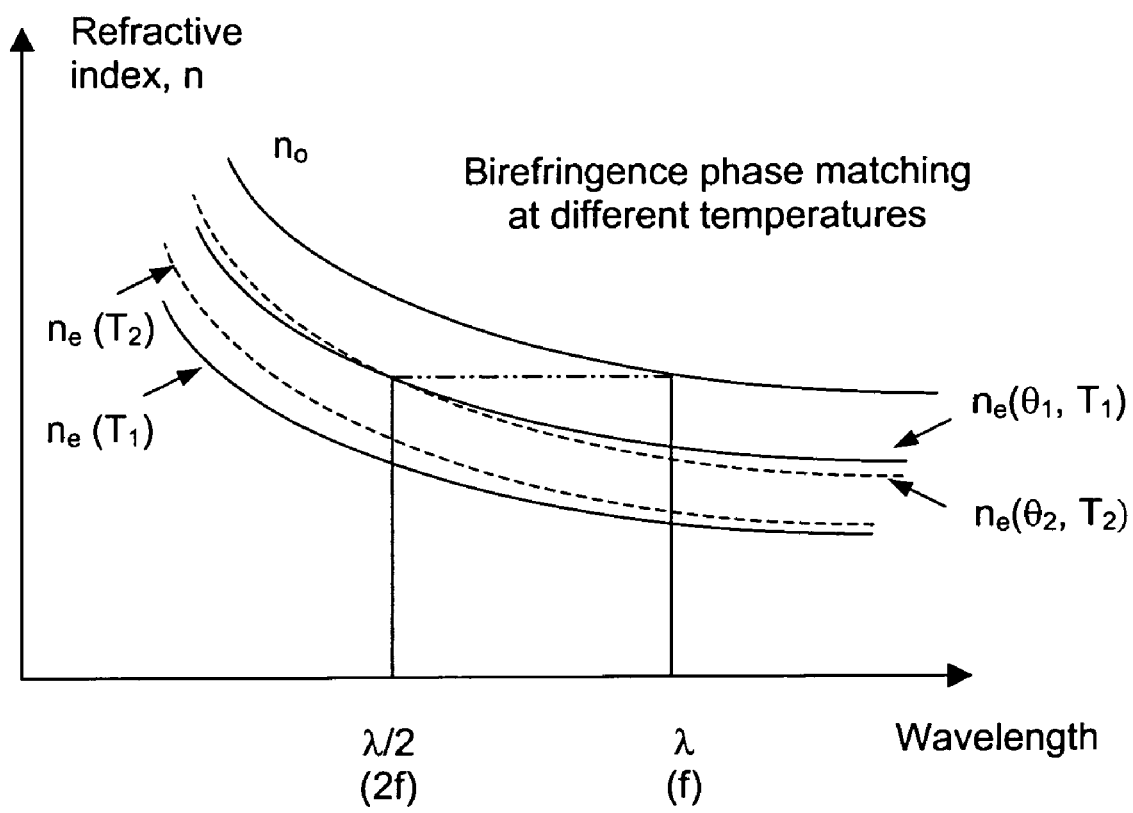
FIG. 3 illustrates the birefringence phase matching at two different temperatures for two nonlinear crystals cut with different crystal orientations.

Secondly, the laser further incorporates a special set of nonlinear crystals for second harmonic generation (SHG) or frequency doubling, which is optimized with a temperature compensation design. The commonly adopted birefringence phase matching method is very sensitive to temperature variation, which is mainly due to the refractive index variation of the nonlinear crystal under different temperatures, especially for the extraordinary refractive index ($n_e$). In this embodiment of the present invention, multiple nonlinear crystals cut at different phase-matching orientations as shown in FIG. 1 are integrated together to compensate for the temperature induced refractive index variation. The operation principle of this approach is illustrated in FIG. 3. For simplicity, negative uniaxial crystals and type I phase matching are employed in the illustration, where the light at 1064 nm ($\lambda$) has o polarization and the light at 532 nm ($\lambda/2$) has e polarization. The refractive index for the 532 nm light is dependent on crystal orientation ($\theta$). The optical axes of the crystals are supposed to be parallel with the plane of the paper. The temperature dependence of the ordinary refractive index ($n_o$) of the crystal is also neglected in the illustration. In the actual apparatus, the nonlinear crystal can be uniaxial or biaxial, and the orientation of the crystal can be adjusted in all the three dimensions. In FIG. 3, two nonlinear crystals are cut at $\theta_1$ and $\theta_2$, respectively, where $\theta_1$ and $\theta_2$ are the angles between the optical axes of the crystals and the axis of the laser cavity. The SHG process can achieve its phase matching condition in the first crystal at temperature $T_1 \pm \Delta T_1$, where $n_e(\theta_1, T_1, \lambda/2) \cong n_o(\lambda)$. While at temperature $T_2 \pm \Delta T_2$, the phase matching condition is satisfied in the second crystal, where $n_e(\theta_2, T_2, \lambda/2) \cong n_o(\lambda)$. Thus the SHG process can maintain adequate conversion efficiency in a broad temperature range from $T_1$ to $T_2$ for the crystal set. By incorporating more crystals with optimum designed phase-matching orientations, the temperature range of the SHG process can be greatly broadened. The incorporation of multiple nonlinear crystals also helps to solve the walk-off problem, in which the two laser beams in different polarizations will gradually separate in space due to the birefringence of the nonlinear crystal. By alternatively inverting the optical axes of the crystals as shown in FIG. 1, the walk-off generated in one crystal will be compensated in another crystal. Thus, the overall walk-off problem is minimized.

Thirdly, the laser further comprises a feedback control system 21 to adjust the drive current (power) of the pump laser diode in response to the output power of the solid state laser as shown in FIG. 1 to compensate for the residual output power fluctuation with temperature. In this scheme, a beam splitter 18 is inserted at the output end of the laser to reflect part of the light into a photo detector 19. The detected laser power information is then used to control the current (power) of the pump laser diode to suppress the temperature induced power fluctuation. When the laser output power drops with ambient temperature change, the feedback control system will increase the drive current. When the laser output power overshoots, the feedback control system will decrease the drive current correspondingly.

While a preferred embodiment of the present invention has been set forth in detail, those skilled in the art who have reviewed the present disclosure will readily appreciate that other embodiments can be realized within the scope of the invention. For example, the pump laser diode can be wavelength stabilized using other injection locking methods. The nonlinear crystal set can comprise several crystals with different materials and thickness to operate in different temperatures. The reflectors defining the laser cavity can be placed at any appropriate positions with the laser. Therefore, the present invention should be construed only by the appended claims.

We claim:

1. A temperature insensitive diode-pumped solid state laser, the laser comprising:
   a. a pair of reflectors for defining a laser cavity;
   b. a wavelength stabilized pump laser diode for emitting pump light at a pump wavelength into the laser cavity;
   c. a laser gain crystal disposed in the laser cavity for absorbing the pump light and for producing a laser output;
   d. an optical beam splitter for tapping a portion of the laser output;
   e. a photo detector for detecting a power of the tapped laser output and for outputting a signal representing the detected power; and
   f. a feedback control system for receiving the signal from the photo detector and for controlling a drive current of the pump laser diode based on the signal from the photo detector;
   wherein the pump wavelength of the pump laser diode is stabilized using a wavelength locking mechanism, and wherein the wavelength locking mechanism comprises a volume Bragg grating.

2. The solid state laser of claim 1, further comprising an optical filter for blocking the pump wavelength in the laser output.

3. The solid state laser of claim 1, wherein the pump wavelength of the pump laser diode is stabilized using a wavelength locking mechanism.

4. The solid sate laser of claim 1, wherein the feedback control system increases the drive current of the pump laser diode when the detected signal on the photo detector decreases and decreases the drive current of the pump laser diode when the detected signal on the photo detector increases.

5. The solid state laser of claim 1, further comprising a plurality of nonlinear crystals for converting a first wavelength of the laser output to a second wavelength.

6. A temperature insensitive diode-pumped solid state laser, the laser comprising:
   a. a pair of reflectors for defining a laser cavity;
   b. a wavelength stabilized pump laser diode for emitting pump light at a pump wavelength into the laser cavity;
   c. a laser gain crystal disposed in the laser cavity for absorbing the pump light and for producing a laser output;
   d. an optical beam splitter for tapping a portion of the laser output;
   e. a photo detector for detecting a power of the tapped laser output and for outputting a signal representing the detected power;
   f. a feedback control system for receiving the signal from the photo detector and for controlling a drive current of the pump laser diode based on the signal from the photo detector, further comprising a plurality of nonlinear crystals for converting a first wavelength of the laser output to a second wavelength; and
   g. a plurality of nonlinear crystals for converting a first wavelength of the laser output to a second wavelength, wherein said plurality of nonlinear crystals are cut or positioned with different spatial orientations to operate in different temperature ranges.

7. A temperature insensitive diode-pumped solid state laser, the laser comprising:
   a. a pair of reflectors for defining a laser cavity;

b. a wavelength stabilized pump laser diode for emitting pump light at a pump wavelength into the laser cavity;
c. a laser gain crystal disposed in the laser cavity for absorbing the pump light and for producing a laser output;
d. an optical beam splitter for tapping a portion of the laser output;
e. a photo detector for detecting a power of the tapped laser output and for outputting a signal representing the detected power;
f. a feedback control system for receiving the signal from the photo detector and for controlling a drive current of the pump laser diode based on the signal from the photo detector, further comprising a plurality of nonlinear crystals for converting a first wavelength of the laser output to a second wavelength; and
g. a plurality of nonlinear crystals for converting a first wavelength of the laser output to a second wavelength, wherein said plurality of nonlinear crystals are composed of different materials and thickness to operate in different temperature ranges.

8. A method for operating a diode-pumped solid state laser having a pump laser diode, a laser cavity, a laser gain crystal, and a plurality of nonlinear crystals such that the laser operates in a temperature-insensitive manner, the method comprising the steps of:
a. stabilizing a wavelength of the pump laser diode using a wavelength locking mechanism;
b. optimizing crystal orientations of the plurality of nonlinear crystals for wide temperature range operation; and
c. controlling a current of the pump laser diode in response to the temperature induced laser power variation.

9. The method of claim 8, wherein the wavelength locking mechanism comprises a volume Bragg grating.

* * * * *